United States Patent
Kim

(10) Patent No.: US 9,722,602 B2
(45) Date of Patent: Aug. 1, 2017

(54) TRANSMITTER

(71) Applicant: SK hynix Inc., Gyeonggi-do (KR)

(72) Inventor: Jae-Heon Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/978,691

(22) Filed: Dec. 22, 2015

(65) Prior Publication Data

US 2017/0179951 A1    Jun. 22, 2017

(51) Int. Cl.
*H03B 1/00* (2006.01)
*H03K 3/00* (2006.01)
*H03K 17/693* (2006.01)
*G05F 3/16* (2006.01)

(52) U.S. Cl.
CPC ............. *H03K 17/693* (2013.01); *G05F 3/16* (2013.01)

(58) Field of Classification Search
USPC ................................................ 327/108–112
See application file for complete search history.

(56) References Cited

U.S. PATENT DOCUMENTS

| | | | | |
|---|---|---|---|---|
| 2006/0220707 A1* | 10/2006 | Kang | ................... | H03K 17/145 327/112 |
| 2013/0057321 A1* | 3/2013 | Rao | ..................... | H04L 25/0274 327/108 |
| 2013/0076395 A1* | 3/2013 | Kim | ................ | H03K 19/01858 326/87 |
| 2014/0292377 A1* | 10/2014 | Gonzalez | ................. | G05F 3/16 327/108 |
| 2016/0248328 A1* | 8/2016 | Zhang | ................ | H02M 3/1584 |

FOREIGN PATENT DOCUMENTS

| KR | 1020080024411 | 3/2008 |
|---|---|---|
| KR | 1020140006459 | 1/2014 |

* cited by examiner

*Primary Examiner* — Adam Houston
(74) *Attorney, Agent, or Firm* — IP & T Group LLP

(57) ABSTRACT

A transmitter includes: a main pull-up driver suitable for pull-up driving an output node; and an auxiliary pull-up driver suitable for pull-up driving the output node based on a voltage of the output node, wherein the auxiliary pull-up driver compensates for non-linear driving current characteristics of the main pull-up driver.

11 Claims, 3 Drawing Sheets

TRANSMITTER

TECHNICAL FIELD

Various embodiments of the present invention relate to a transmitter for transmitting signals to and from an integrated circuit.

BACKGROUND

Integrated circuits may operate by exchanging signals with peripheral devices. For example, memory devices, such as DRAMs and flash memory devices may exchange signals with a memory controller. Also, central processing units (CPUs) may exchange data with a variety of semiconductor memory devices on a mother board. Furthermore signal transmission may be performed between integrated circuits of different devices as well as between integrated circuits included inside the same semiconductor device. A circuit for transmitting signals is typically referred to as a transmitter or an output driver.

DISCUSSION OF THE RELATED ART

FIG. 1 is a diagram illustrating a conventional transmitter.

Referring to FIG. 1, a conventional transmitter includes a P-type metal-oxide-semiconductor (PMOS) transistor 101, a resistor 102, an N-type metal-oxide-semiconductor (NMOS) transistor 103 and a resistor 104.

When a pull-up driving signal PUB is activated to a low logic level, the PMOS transistor 101 is turned on, and thus an output node OUTPUT is driven by a pull-up voltage through the PMOS transistor 101 and the resistor 102. That is, a signal having a high logic level is output through the output node OUTPUT. The pull-up driving signal PUB is activated when the transmitter transmits a signal having a high logic level.

When a pull-down driving signal PD is activated to a high logic level, the NMOS transistor 103 is turned on, and thus the output node OUTPUT is driven by a pull-down voltage VSS (i.e., a ground voltage) through the NMOS transistor 103 and the resistor 104. That is, a signal having a low logic level is output through the output node OUTPUT. The pull-down driving signal PD is activated when the transmitter transmits a signal having a low logic level.

Passive resistors 102 and 104 are used for securing the linearity of the driving current flowing through the transmitter. However, the parasitic capacitance of the transmitter may generally be increased due to the use of the resistors 102 and 104. As a result, it may be difficult for the transmitter to operate at a high speed.

SUMMARY

Various embodiments of the invention are directed to a transmitter capable of securing the linearity of driving current without the use of passive resistors.

In an embodiment of the present invention, a transmitter may include: a main pull-up driver suitable for pull-up driving an output node; and an auxiliary pull-up driver suitable for pull-up driving the output node when the main pull-up driver is enabled based on a level of the output node, wherein the auxiliary pull-up driver compensates for nonlinear driving current characteristics of the main pull-up driver.

The transmitter may further include a main pull-down driver for pull-down driving the output node; and an auxiliary pull-down driver suitable for pull-down driving the output node when the main pull-down driver is enabled based on the voltage of the output node. The auxiliary pull-down driver may compensate for nonlinear driving characteristics of the main pull-down driver.

When the main pull-up driver is disabled, the auxiliary pull-up driver may not drive the output node regardless of the voltage of the output node.

When the main pull-down driver is disabled, the auxiliary pull-down driver may not drive the output node regardless of the voltage of the output node.

The main pull-up driver may include a first PMOS transistor for pull-up driving the output node in response to a pull-up driving signal.

The auxiliary pull-up driver may include a second PMOS transistor for applying a pull-up voltage in response to the pull-up driving signal; a third PMOS transistor for transmitting the voltage of the output node in response to the pull-up driving signal; and a fourth PMOS transistor for pull-up driving the output node using the pull-up voltage applied by the second PMOS transistor in response to the voltage of the output node which is transmitted by the third PMOS transistor.

The auxiliary pull-up driver may include the second PMOS transistor for applying the pull-up voltage in response to the pull-up driving signal; and the third PMOS transistor for pull-up driving the output node using the pull-up voltage applied by the second PMOS transistor in response to the voltage of the output node.

The main pull-down driver may include a first NMOS transistor for pull-down driving the output node in response to a pull-down driving signal.

The auxiliary pull-down driver may include a second NMOS transistor for applying a pull-down voltage in response to the pull-down driving signal; a third NMOS transistor for transmitting the voltage of the output node in response to the pull-down driving signal; and a fourth NMOS transistor for pull-up driving the output node using the pull-down voltage applied by the second NMOS transistor in response to the voltage of the output node which is transmitted by the third NMOS transistor.

The auxiliary pull-down driver may include the second NMOS transistor for applying the pull-down voltage in response to the pull-down driving signal; and the third NMOS transistor for pull-down driving the output node using the pull-down voltage applied by the second NMOS transistor in response to the voltage of the output node.

In an embodiment of the present invention, a transmitter may include: a main pull-down driver for pull-down driving an output node; and an auxiliary pull-down driver suitable for pull-down driving the output node in response to a voltage of the output node.

When the main pulldown driver is disabled, the auxiliary pull-down driver may stop driving the output node regardless of the voltage of the output node.

The main pull-down driver may include a first NMOS transistor for pull-down driving the output node in response to a pull-down driving signal.

The auxiliary pull-down driver may include a second NMOS transistor for applying a pull-down voltage in response to the pull-down driving signal; a third NMOS transistor for transmitting the voltage of the output node in response to the pull-down driving signal; and a fourth NMOS transistor for pull-down driving the output node using the pull-down voltage applied by the second NMOS transistor in response to the voltage of the output node which is transmitted by the third NMOS transistor.

The auxiliary pull-down driver may include the second NMOS transistor for applying the pull-down voltage in response to the pull-down driving signal; and the fourth NMOS transistor for pull-down driving the output node using the pull-down voltage applied by the second NMOS transistor in response to the voltage of the output node.

In an embodiment of the present invention, a transmitter may include: a first PMOS transistor suitable for pull-up driving an output node based on a pull-up driving signal; a second PMOS transistor suitable for supplying a pull-up voltage based on the pull-up driving signal; a third PMOS transistor suitable for pull-up driving the output node using the pull-up voltage supplied through the second PMOS transistor based on a voltage of the output node; a first NMOS transistor suitable for pull-down driving the output node based on a pull-down driving signal; a second NMOS transistor suitable for supplying a pull-down voltage based on the pull-down driving signal; and a third NMOS transistor suitable for pull-down driving the output node using the pull-down voltage supplied through the second NMOS transistor based on the voltage of the output node.

The transmitter may further include a fourth PMOS transistor suitable for transmitting the voltage of the output node based on the pull-up driving signal.

The transmitter may further include a fourth NMOS transistor suitable for transmitting the voltage of the output node based on the pull-down driving signal.

DETAILED DESCRIPTION

Figure 1:
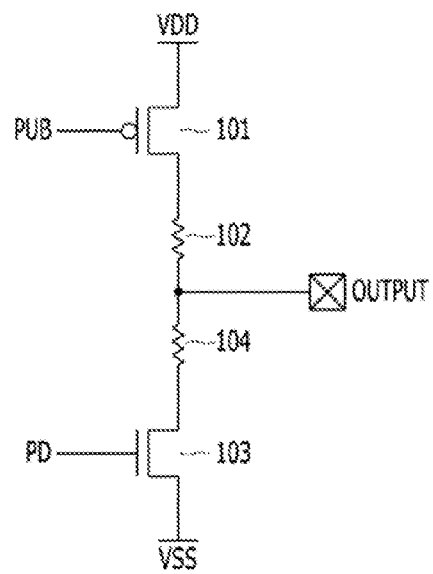
FIG. 1 is a diagram illustrating a conventional transmitter.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated to clearly illustrate features of the embodiments. It is also noted that in this specification, "connected/coupled" refers to one component not only directly coupling another component, but also indirectly coupling another component through an intermediate component. In addition, a singular form may include a plural form as long as it is not specifically mentioned.

Figure 2:
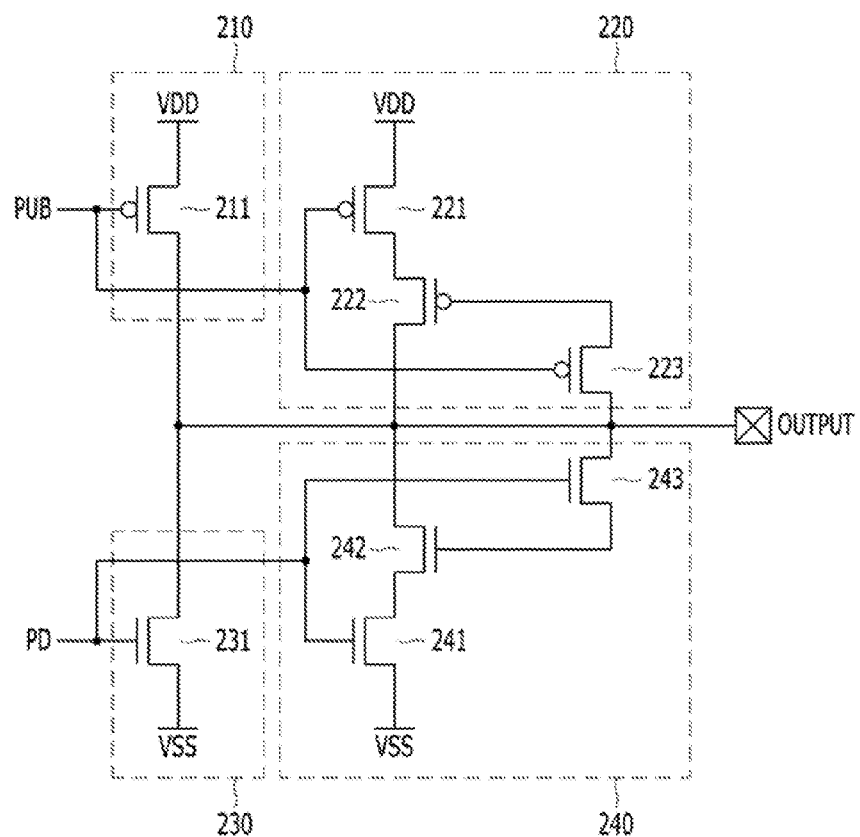
FIG. 2 is a diagram illustrating a transmitter in accordance with an embodiment of the present invention.

FIG. 2 illustrates an example of a transmitter in accordance with the present invention.

Referring to FIG. 2, a transmitter may include a main pull-up driver 210, an auxiliary pull-up driver 220, a main pull-down driver 230 and an auxiliary pull-down driver 240.

The main pull-up driver 210 may pull-up drive an output node in a high logic signal driving period. The main pull-up driver 210 may include a PMOS transistor 211 for pull-up driving the output node OUTPUT in response to a pull-up driving signal PUB. Unlike the conventional transmitter of FIG. 1, the main pull-up driver 210 does not include a passive resistor. The pull-up driving signal PUB may be activated to a low logic level when the transmitter transmits a signal having a high logic level.

The auxiliary pull-up driver 220 may be activated in the high logic signal driving period, and may pull-up drive the output node OUTPUT in response to a voltage of the output node. The auxiliary pull-up driver 220 may not drive the output node OUTPUT regardless of the voltage of the output node OUTPUT in a period other than the high logic signal driving period. The auxiliary pull-up driver 220 may compensate for non-linear driving current characteristics of the main pull-up driver 210.

The auxiliary pull-up driver 220 may include a PMOS transistor 221 for applying a pull-up voltage VDD in response to the pull-up driving signal PUB, a PMOS transistor 223 for transmitting the voltage of the output node OUTPUT in response to the pull-up driving signal PUB and a PMOS transistor 222 for pull-up driving the output node OUTPUT using the pull-up voltage VDD applied through the PMOS transistor 221 in response to the voltage of the output node OUTPUT which is transmitted through the PMOS transistor 223.

In operation, the PMOS transistors 221 and 223 may be turned on when the pull-up driving signal PUB is activated to a low logic level. A pull-up voltage VDD may be applied to the PMOS transistor 222, the voltage of the output node OUTPUT may be transmitted to a gate of the PMOS transistor 222 and the output node OUTPUT may be driven according to the voltage of the output node OUTPUT. When the pull-up driving signal PUB is deactivated to a high logic level, the auxiliary pull-up driver 220 may not drive the output node OUTPUT because the PMOS transistors 221 and 223 are turned off. The PMOS transistor 221 may activate/deactivate the auxiliary pull-up driver 220 and the PMOS transistor 222 may drive the output node OUTPUT. The PMOS transistor 223 may prevent the gate of the PMOS transistor 222 from being damaged or destroyed by static electricity which may flow into the output node OUTPUT.

The main pull-down driver 230 may pull-down drive the output node OUTPUT in a 'low' signal (data) driving period. The main pull-down driver 230 may include a NMOS transistor 231 for pull-down driving the output node in response to a pull-down driving signal PD. Unlike the conventional transmitter of FIG. 1, the main pull-down driver 230 does not include a passive resistor. The pull-down driving signal PD may be activated to the high logic level when the transmitter transmits a signal having a low logic level.

The auxiliary pull-down driver 240 may include a NMOS transistor 241 for applying a pull-down voltage VSS (i.e., a ground voltage) in response to the pull-down driving signal PD, a NMOS transistor 243 for transmitting the voltage of the output node OUTPUT in response to the pull-down driving signal PD and a NMOS transistor 242 for pull-down driving the output node OUTPUT using the pull-down voltage VSS applied through the NMOS transistor 241 in response to the voltage of the output node OUTPUT which is transmitted through the NMOS transistor 243.

In operation, if the pull-down driving signal PD is activated to the high logic level, the NMOS transistors 241 and 243 may be turned on. Therefore, the pull-down voltage VSS may be applied to the NMOS transistor 242, the voltage of the output node OUTPUT may be transmitted to a gate of the NMOS transistor 242 and the output node OUTPUT may be driven according to the voltage of the output node OUTPUT. When the pull-down driving signal PD is deactivated to the low logic level, the auxiliary pull-down driver 240 does not drive the output node OUTPUT because the NMOS transistors 241 and 243 are turned off. In the auxiliary pull-down driver 240, the NMOS transistor 241 may activate or deactivate the auxiliary pull-down driver 240 and the NMOS transistor 242 may drive the output node OUTPUT. The NMOS transistor 243 may prevent the gate of the NMOS transistor 242 from being damaged or destroyed by the static electricity which may flow into the output node OUTPUT.

In FIG. 2, the transmitter may be used in signal (e.g., data) transmission between two or more semiconductor devices as well as between internal circuits in a single semiconductor device.

The main pull-up driver 210, the auxiliary pull-up driver 220, the main pull-down driver 230 and the auxiliary pull-down driver 240 of FIG. 2 may be used separately. For example, the main pull-up driver 210 and the auxiliary pull-up driver 220 may be used with a pull-down driver having a conventional configuration such as, for example, the NMOS transistor 103 and the resistor 104 in FIG. 1. Also, the main pull-down driver 230 and the auxiliary pull-down driver 240 may be used with a pull-up driver having a conventional configuration such as, for example, the PMOS transistor 101 and the resistor 102 in FIG. 1). The transmitter shown in FIG. 3 has a similar configuration to the transmitter shown in FIG. 2, except that the transmitter of FIG. 3 does not have the PMOS transistor 223 and the NMOS transistor 243 shown in FIG. 2.

Figure 3:
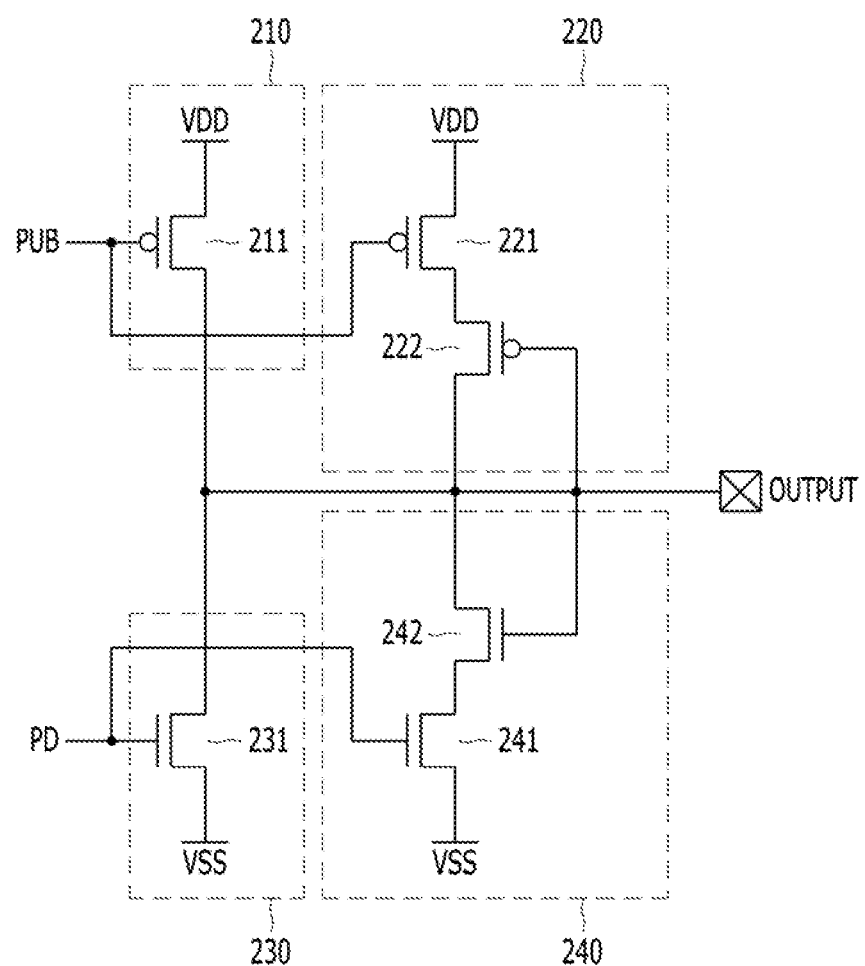
FIG. 3 is a diagram illustrating a transmitter in accordance with another embodiment of the present invention.

Referring now to FIG. 3, it should be noted that the PMOS transistor 223 is omitted from the auxiliary pull-up driver 220 in FIG. 3 and the gate of the PMOS transistor 222 is directly coupled to the output node OUTPUT. Also, the NMOS transistor 243 is omitted from the auxiliary pull-down driver 240 in FIG. 2 and the gate of the NMOS transistor 242 is directly coupled to the output node OUTPUT.

The design of FIG. 2 is advantageous when it is desired to protect the transmitter from static electricity. However, when there is no need to protect the gates of the PMOS transistor 223 and NMOS transistor 243 because static electricity is less likely to occur in the output node OUTPUT, it may then be possible to design the transmitter as shown in FIG. 3. The transmitter of FIG. 3 may be advantageous because of its simpler structure in applications not concerned with damage that may be caused by static electricity.

Figure 4:
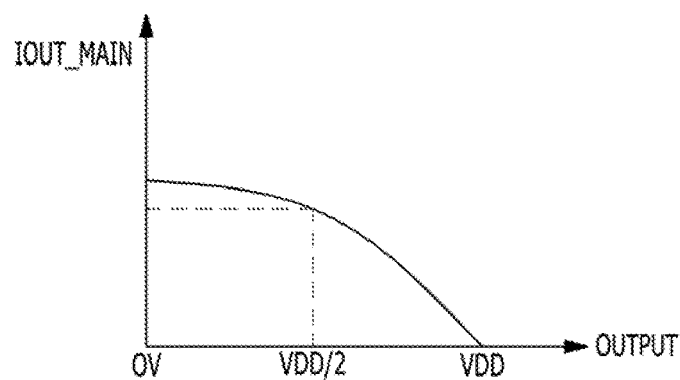
FIGS. 4 to 6 are diagrams illustrating the driving current of the transmitters shown in FIGS. 2 and 3.
Figure 5:
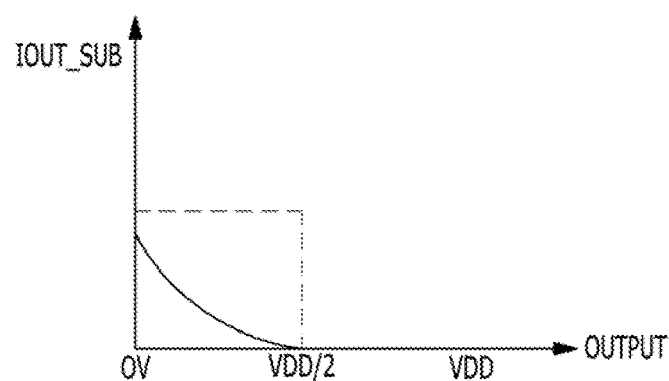
Figure 6:
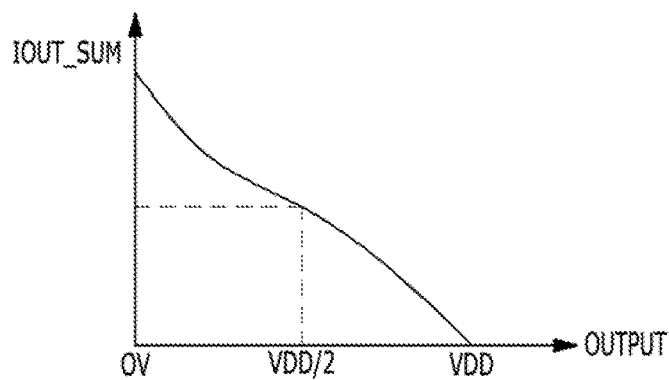

FIG. 4 to FIG. 6 are diagrams illustrating the linearity of the driving current of the transmitters of FIGS. 2 and 3.

FIG. 4 shows the driving current IOUT_MAIN that the main pull-up driver 210 drives the output node OUTPUT when the pull-up driving signal PUB is activated, according to the voltage of the output node OUTPUT. Referring to FIG. 4, the driving current IOUT_MAIN of the main pull-up driver 210 is non-linear in a section that the voltage of the output node OUTPUT is low.

FIG. 5 shows the driving current IOUT_SUB that the auxiliary pull-up driver 220 drives the output node OUTPUT when the pull-up driving signal PUB is activated, according to the voltage of the output node OUTPUT. Referring to FIG. 5, the driving current IOUT_SUB of the auxiliary pull-up driver 220 has a linear characteristic in a section that the voltage of the output node OUTPUT is low. However, the driving current IOUT_SUB of the auxiliary pull-up driver 220 is zero in the section that the voltage of the output node OUTPUT is high.

FIG. 6 shows the driving current IOUT_SUM of the transmitter which is the sum of the driving current IOUT_MAIN of the main pull-up driver 210 and the driving current IOUT_SUB of the auxiliary pull-up driver 220. Referring to FIG. 6, the driving current IOUT_SUM of the transmitter has a substantially linear characteristic in the voltage fluctuation range of the output node OUTPUT.

Although various embodiments of the invention have been described for illustrative purposes, it will be apparent to those skilled in the art that various changes and modifications may be made without departing from the spirit and scope of the invention as defined in the following claims.

What is claimed is:

1. A transmitter comprising:
   a main pull-up driver suitable for pull-up driving an output node in response to a pull-up driving signal; and
   an auxiliary pull-up driver comprising first and second PMOS transistors connected in series between a pull-up voltage terminal and the output node, wherein the first PMOS transistor is turned on/off in response to the pull-up driving signal and the second PMOS transistor is turned on/off in response to the output node.

2. The transmitter of claim 1, further comprising:
   a main pull-down driver suitable for pull-down driving the output node in response to a pull-down driving signal; and
   an auxiliary pull-down driver comprising first and second NMOS transistors connected in series between a pull-down voltage terminal and the output node, wherein the first NMOS transistor is turned on/off in response to the pull-down driving signal and the second NMOS transistor is turned on/off in response to the output node.

3. The transmitter of claim 1, wherein the main pull-up driver comprises a third PMOS transistor that pull-up drives the output node in response to the pull-up driving signal.

4. The transmitter of claim 3, wherein the auxiliary pull-up driver further comprises:
   a fourth PMOS transistor that transmits the voltage of the output node to a gate of the second PMOS transistor in response to the pull-up driving signal.

5. The transmitter of claim 2, wherein the main pull-down driver comprises a third NMOS transistor that pull-down drives the output node in response to the pull-down driving signal.

6. The transmitter of claim 5, wherein the auxiliary pull-down driver further comprises:
   a fourth NMOS transistor that transmits the voltage of the output node to a gate of the second NMOS transistor in response to the pull-down driving signal.

7. A transmitter comprising:
   a main pull-down driver suitable for pull-down driving an output node in response to a pull-down driving signal; and
   an auxiliary pull-down driver comprising first and second NMOS transistors connected in series between a pull-down voltage terminal and the output node, wherein the first NMOS transistor is turned on/off in response to the pull-down driving signal and the second NMOS transistor is turned on/off in response to the output node.

8. The transmitter of claim 7, wherein the main pull-down driver comprises a third NMOS transistor that pull-down drives the output node in response to the pull-down driving signal.

9. The transmitter of claim 8, wherein the auxiliary pull-down driver further comprises:

a fourth NMOS transistor that transmits the voltage of the output node to a gate of the second NMOS transistor in response to the pull-down driving signal.

10. A transmitter comprising:
a first PMOS transistor suitable for pull-up driving an output node based on a pull-up driving signal;
a second PMOS transistor suitable for supplying a pull-up voltage based on the pull-up driving signal;
a third PMOS transistor suitable for pull-up driving the output node using the pull-up voltage supplied through the second PMOS transistor based on a voltage of the output node;
a first NMOS transistor suitable for pull-down driving the output node based on a pull-down driving signal;
a second NMOS transistor suitable for supplying a pull-down voltage based on the pull-down driving signal;
a third NMOS transistor suitable for pull-down driving the output node using the pull-down voltage supplied through the second NMOS transistor based on the voltage of the output node; and
a fourth PMOS transistor suitable for transmitting the voltage of the output node based on the pull-up driving signal.

11. The transmitter of claim 10, further comprising a fourth NMOS transistor suitable for transmitting the voltage of the output node based on the pull-down driving signal.

* * * * *